United States Patent
Akhtar et al.

(10) Patent No.: US 8,117,004 B2
(45) Date of Patent: *Feb. 14, 2012

(54) TESTING MODULE, TESTING APPARATUS AND TESTING METHOD

(75) Inventors: Sami Akhtar, Tokyo (JP); Kiyoshi Murata, Tokyo (JP); Tomoyuki Sugaya, Tokyo (JP)

(73) Assignee: Advantest Corporation, Tokyo (JP)

( * ) Notice: Subject to any disclaimer, the term of this patent is extended or adjusted under 35 U.S.C. 154(b) by 387 days.

This patent is subject to a terminal disclaimer.

(21) Appl. No.: 12/058,754

(22) Filed: Mar. 30, 2008

(65) Prior Publication Data

US 2009/0248347 A1    Oct. 1, 2009

(51) Int. Cl.
  *G01R 27/28*    (2006.01)
  *G11C 29/00*    (2006.01)
(52) U.S. Cl. ..................... 702/120; 714/718
(58) Field of Classification Search .......... 702/16, 702/57, 81, 84, 108, 117–124, 127, 182–183, 702/189; 714/1–2, 5–6, 25, 27, 30, 39, 46–49, 714/715, 718–720, 724, 735–736, 738–739, 714/763, 766, 768, 824; 324/500, 537, 555, 324/763–765
See application file for complete search history.

(56) References Cited

U.S. PATENT DOCUMENTS

| | | | | |
|---|---|---|---|---|
| 4,797,886 | A * | 1/1989 | Imada | 714/718 |
| 2006/0052964 | A1* | 3/2006 | Sugaya et al. | 702/117 |
| 2008/0235550 | A1* | 9/2008 | Yamada et al. | 714/738 |
| 2009/0249137 | A1* | 10/2009 | Akhtar et al. | 714/718 |

FOREIGN PATENT DOCUMENTS

| | | |
|---|---|---|
| JP | 2002-189632 | 7/2002 |
| JP | 2005-141532 | 6/2005 |
| JP | 2005249735 | 9/2005 |
| JP | 2006-053160 | 2/2006 |

OTHER PUBLICATIONS

"Search Report of PCT application", issued on May 12, 2009, p. 1-p. 6.
International Preliminary Report on Patentability (Chapter I of the Patent Cooperation Treaty) for International Application No. PCT/JP2009/001423, mailed on Dec. 13, 2010 (5 pages).

* cited by examiner

*Primary Examiner* — Michael Nghiem
*Assistant Examiner* — Toan M Le
(74) *Attorney, Agent, or Firm* — Osha Liang LLP

(57) ABSTRACT

To increase the overall efficiency of a test apparatus, provided is a test module that includes an instruction information storage section that stores instruction information indicating an order in which basic patterns are expanded; a basic pattern data storage section that stores basic pattern data; a plurality of pattern generating sections that each include a temporary instruction information storage section, which temporarily stores a portion of the instruction information, and that each generate a test pattern supplied to a device under test by expanding the basic pattern data in the order indicated by the instruction information stored in the corresponding temporary instruction information storage section; and a plurality of position information storage sections that independently store position information indicating reading positions of the instruction information stored in the instruction information storage section that is common to the plurality of pattern generating sections, in association with each pattern generating section.

8 Claims, 5 Drawing Sheets

TESTING MODULE, TESTING APPARATUS AND TESTING METHOD

BACKGROUND

1. Technical Field

The present invention relates to a test module, a test apparatus, and a test method. In particular, the present invention relates to a test module, a test apparatus, and a test method suitable for testing a multitude of relatively small semiconductor devices.

2. Related Art

Japanese Patent Application Publication No. 2005-249735, for example, discloses a pattern generator and a test apparatus that can accurately and continuously generate test patterns for testing electronic devices. This pattern generator stores test data blocks in a cache memory in an order indicated by instruction information, and thereafter sequentially outputs these test data blocks as the test pattern. A plurality of these pattern generators are controlled by a single control section to test a single stand-alone electronic device. When these pattern generators controlled by the single control section are supplied with a single set of instruction information, each pattern generator may not be able to independently generate the test pattern.

If the pattern generators described above are used to test relatively small electronic devices having few terminals for testing, the number of pattern generators controlled by the single control section exceeds the number of terminals for testing. In other words, excess pattern generators that are not connected to a terminal are left unused, which decreases the overall efficiency of the test apparatus.

SUMMARY

Therefore, it is an object of an aspect of the innovations herein to provide a test apparatus and test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test module may include a test module, including an instruction information storage section that stores instruction information indicating an order in which basic patterns are expanded; a basic pattern data storage section that stores basic pattern data; a plurality of pattern generating sections that each include a temporary instruction information storage section, which temporarily stores a portion of the instruction information, and that each generate a test pattern supplied to a device under test by expanding the basic pattern data in the order indicated by the instruction information stored in the corresponding temporary instruction information storage section; and a plurality of position information storage sections that independently store position information indicating reading positions of the instruction information stored in the instruction information storage section that is common to the plurality of pattern generating sections, in association with each pattern generating section.

The plurality of pattern generating sections may independently generate each test pattern provided to devices under test of the same type. The test module may further include an instruction information control section that reads a portion of the instruction information stored in the instruction information storage section from the reading positions indicated by the position information stored in the plurality of position information storage sections, and stores the read portions in the temporary instruction information storage sections, wherein the instruction information control section is independently associated with each of the plurality of pattern generating sections. The test module may further include an arbiter that arbitrates reading requests generated by the plurality of instruction information control sections to read the portion of the instruction information from the instruction information storage section.

The test module may further include comparison detecting sections that compare an expected pattern, which is expected as the output of the device under test when the device under test is supplied with the test pattern, to an output pattern that is actually output by the device under test when supplied with the test pattern, and detect a fail result when the test pattern and the output pattern are not identical and result storage sections that store fail information indicating content of the fail result detected by the comparison detecting section. One comparison detecting section and one result storage section may be independently associated with each of the plurality of pattern generating sections. The result storage sections may store the fail information in association with the basic pattern in which the fail occurred.

According to a second aspect related to the innovations herein, one exemplary test apparatus may include a test apparatus, including an instruction information storage section that stores instruction information indicating an order in which basic patterns are expanded; a basic pattern data storage section that stores basic pattern data; a plurality of pattern generating sections that each include a temporary instruction information storage section, which temporarily stores a portion of the instruction information, and that each generate a test pattern supplied to a device under test by expanding the basic pattern data in the order indicated by the instruction information stored in the corresponding temporary instruction information storage section; and a plurality of position information storage sections that independently store position information indicating reading positions of the instruction information stored in the instruction information storage section that is common to the plurality of pattern generating sections, in association with each pattern generating section.

According to a third aspect related to the innovations herein, one exemplary test method may include a test method, including: storing basic pattern data; storing instruction information, in common for a plurality of pattern generating sections, indicating an order in which basic patterns are expanded; independently storing position information indicating reading positions of the instruction information stored in the instruction information storage section, in association with each pattern generating section; temporarily and independently storing a portion of the instruction information in association with each pattern generating section; and generating a test pattern supplied to a device under test, in association with each pattern generating section, by expanding the basic pattern data in the order indicated by the instruction information stored during the temporary and independent storage of the portion of the instruction information.

The summary clause does not necessarily describe all necessary features of the embodiment of the present invention. The present invention may also be a sub-combination of the features described above. The above and other features and advantages of the present invention will become more apparent from the following description of the embodiment taken in conjunction with the accompanying drawings.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
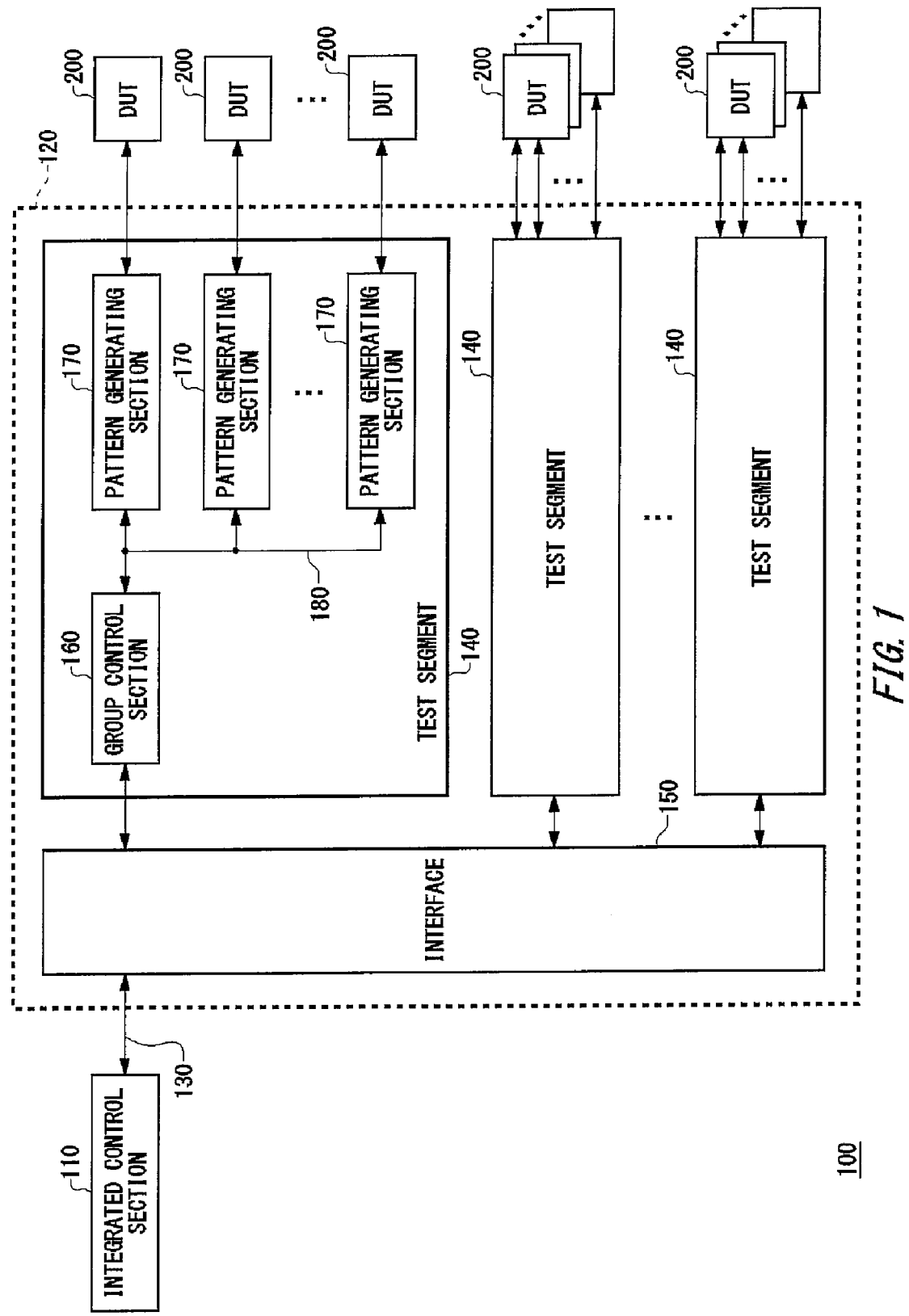
FIG. 1 is a functional block diagram of a test apparatus 100 of the present embodiment together with DUTs 200.

FIG. 1 is a functional block diagram of a test apparatus 100 of the present embodiment together with devices under test (DUTs) 200. The test apparatus 100 is provided with an integrated control section 110, a test module 120, and a standard bus 130. The test module 120 has a plurality of test segments 140 and an interface 150. Each test segment 140 has a group control section 160, a pattern generating section 170, and an internal bus 180.

The integrated control section 110 sends and receives data via the standard bus 130 to control the test module 120. The integrated control section 110 may be an information processor that operates according to software programmed in a computer and the like. If the integrated control section 110 operates according to such software, the testing order can be programmed.

The test module 120 tests the DUTs 200 under control of the integrated control section 110. The test module 120 can provide functions corresponding to the types of DUTs 200. For example, if the DUTs are logic circuits, DRAMs (dynamic memories), EEPROMs (electrically erasable and programmable read only memories), analog circuits, and the like, a test module 120 can be used that is specialized for logic circuits, DRAMs, EEPROMs, analog circuits, and the like. A single test module 120 is shown in FIG. 1, but a plurality of test modules 120 may be provided. Furthermore, test modules 120 having different functions may be connected to the standard bus 130 as long as these test modules 120 are compatible with the standard bus 130, can transmit data, and are controlled by the integrated control section 110.

The standard bus 130 transmits control data from the integrated control section 110 to the test module 120. The test module 120 also transmits acquired test data to the integrated control section 110. The plurality of test modules 120 having different functions can be connected to the standard bus 130 as the test module 120, as described above. The test module 120 can be an arbitrary combination that is compatible with the standard bus 130, and the standard bus 130 obeys a protocol that can interface with the test module 120.

The test segment 140 designates a range of the pattern generating sections 170 controlled by a single group control section 160. The number of pattern generating sections 170 included in one test segment 140 can be chosen from a range suitable for testing the DUTs 200. The pattern generating sections 170 included in a single test segment 140 generate identical pattern strings. In the test apparatus 100 of the present embodiment, each pattern generating section 170 included in a single test segment 140 is controlled to generate the pattern string with an independent timing.

The test segments 140 perform data input and output with the integrated control section 110 via the interface 150. The interface 150 is compatible with a protocol obeyed by the standard bus 130.

One group control section 160 is included in each test segment 140 and controls the pattern generating sections 170 in the test segment 140. The group control sections 160 communicate with the integrated control section 110 via the interface 150. Each group control section 160 controls all of the pattern generating sections 170 of the same test segment 140, under the control of the integrated control section 110.

The pattern generating sections 170 generate the test patterns supplied to the DUTs 200. A plurality of pattern generating sections 170 are included in a single test segment 140. In other words, a single group control section 160 controls a plurality of pattern generating sections 170.

The internal buses 180 transmit data from the group control sections 160 to the pattern generating sections 170. The transmitted data may be data concerning a basic test pattern serving as an element of the test pattern, supplementary information indicating the order in which the reference test patterns are expanded, and the like.

Figure 2:
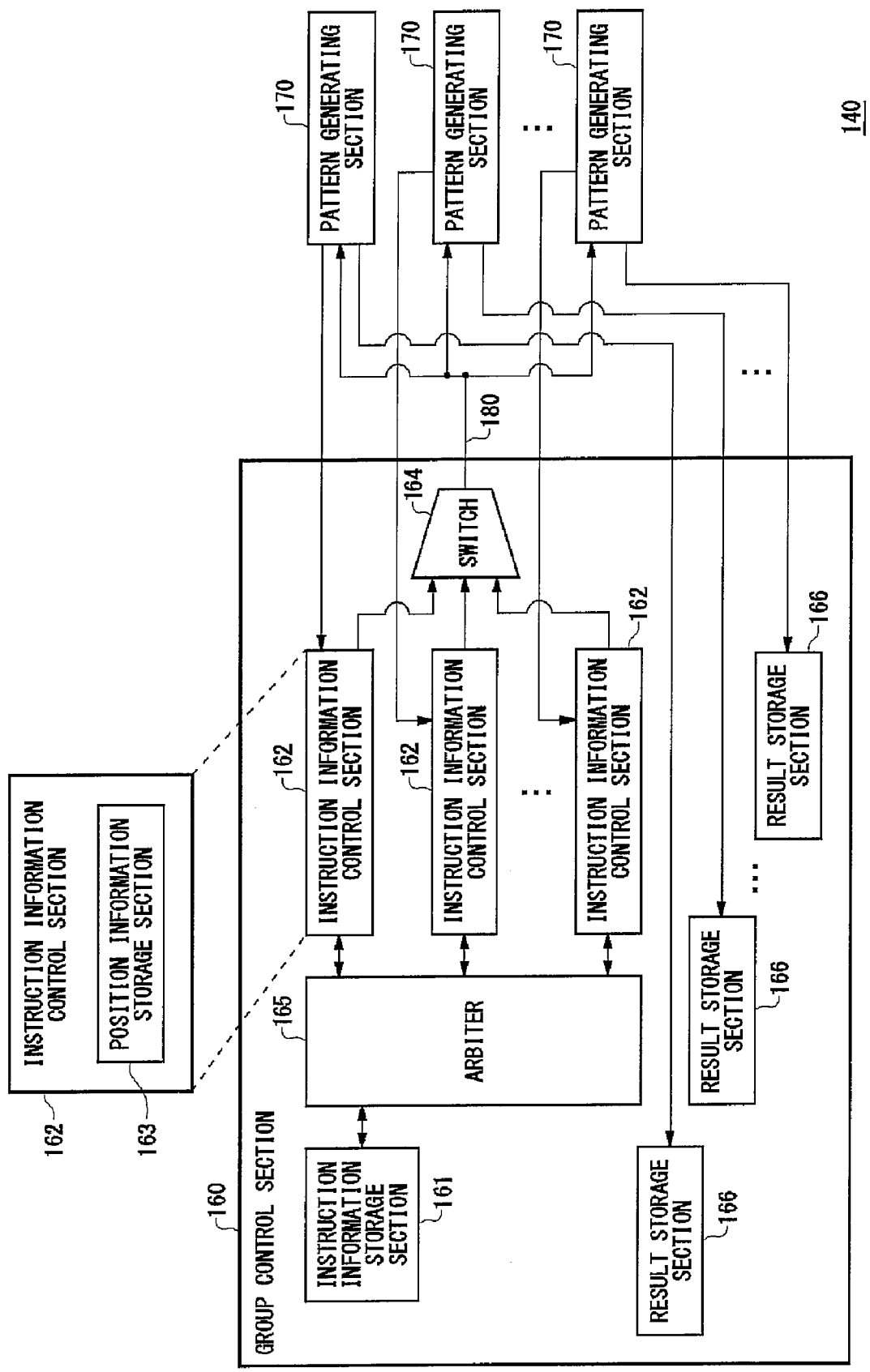
FIG. 2 is a functional block diagram of the test segment 140.

FIG. 2 is a functional block diagram of the test segment 140. In particular, FIG. 2 shows a detailed functional view of the group control section 160. The group control section 160 is provided with an instruction information storage section 161, an instruction information control section 162, a switch 164, an arbiter 165, and a result storage section 166. The instruction information control section 162 has a position information storage section 163.

Figure 3:
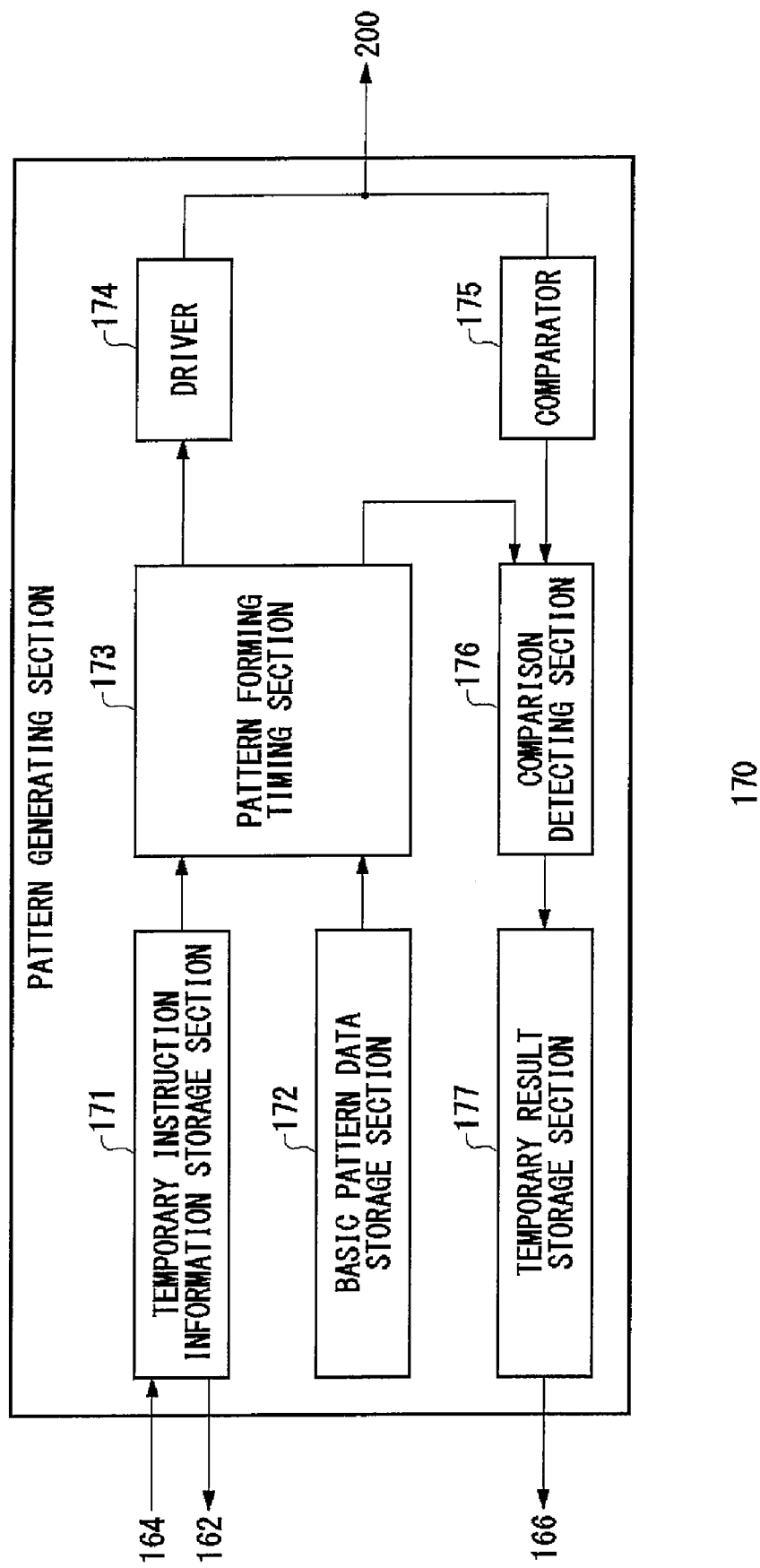
FIG. 3 is a functional block diagram of the pattern generating section 170.

FIG. 3 is a functional block diagram of the pattern generating section 170. The pattern generating section 170 is provided with a temporary instruction information storage section 171, a basic pattern data storage section 172, a pattern forming timing section 173, a driver 174, a comparator 175, a comparison detecting section 176, and a temporary result storage section 177.

The basic pattern data storage section 172 stores data indicating a basic pattern. The basic pattern may be a single unit of a test pattern. The test pattern can be generated by sequentially expanding a plurality of test patterns to create pattern strings. One basic pattern data storage section 172 is disposed in each pattern generating section 170. If a plurality of pattern generating sections 170 use a common basic pattern, however, the basic pattern data storage section 172 may be disposed separately to be in common with the plurality of pattern generating sections 170.

The instruction information storage section 161 stores instruction information that indicates the order in which to expand the basic patterns. The instruction information stored in the instruction information storage section 161 may be a list of the basic patterns. The pattern generating section 170 can generate complex test patterns by expanding the basic patterns in the order indicated by the list. By listing the basic patterns according to the instruction information, consecutive expansion of the basic patterns is possible, so that a continuous test pattern can be generated without gaps.

The temporary instruction information storage section 171 temporarily stores a portion of the instruction information. The temporary instruction information storage section 171 is disposed in the pattern generating section 170 and holds a list of the nearest basic patterns to be expanded by the pattern generating section 170. The temporary instruction information storage section 171 may be a first-in first-out (FIFO) buffer, but is not limited to this. For example, the temporary instruction information storage section 171 may instead be a memory in which a recording position is specified by a register and an address, or may be a cache memory such as an SRAM.

The instruction information control sections 162 control reading of the instruction information. Each instruction information control section 162 is provided with a position information storage section 163. Each instruction information control section 162 reads the instruction information based on the position information stored in the position information storage section 163. In other words, each instruction information control section 162 reads the portions of the instruction information stored in the instruction information storage section 161 that correspond to the reading positions indicated by the pieces of position information stored in the position information storage section 163. Each instruction information control section 162 stores the read instruction information in the corresponding temporary instruction information storage section 171.

One instruction information control section 162 is provided to each pattern generating section 170 and is independently associated with the pattern generating section 170. By providing each pattern generating section 170 with the instruction information control section 162 and the position information storage section 163 in this way, each pattern generating section 170 can independently generate the test pattern.

If each pattern generating section 170 tests different DUTs 200 and the DUTs 200 are of the same type, the data indicating the basic pattern can be used commonly since tests having the same content are performed. The timing with which the instruction information is read, however, cannot be used commonly. Specifically, since each DUT 200 is a single stand-alone device, instruction information must be provided independently to the pattern generating sections 170 if an error occurs in the pacing of the test. In the present embodiment, each pattern generating section 170 is provided with the position information storage section 163 to be able to respond to an output timing error of the test pattern.

Each pattern generating section 170 need not be provided with an instruction information control section 162. If a plurality of position information storage sections 163 are used so that a plurality of pieces of instruction information can be processed simultaneously, the plurality of pattern generating sections 170 can use a common instruction information control section 162.

The position information storage sections 163 record the reading positions of the instruction information of the pattern generating sections 170, as described above. In other words, each position information storage section 163 independently stores the position information indicating the reading position of the instruction information stored in the common instruction information storage section 161 by the pattern generating sections 170, in association with the corresponding pattern generating section 170.

The arbiter 165 arbitrates the reading requests generated by the instruction information control sections 162 when the instruction information control sections 162 read a portion of the instruction information from the instruction information storage section 161. The switch 164 is disposed between each instruction information control section 162 and the corresponding pattern generating section 170, and controls the transfer of data through the internal bus 180. The switch 164 may be provided as hardware or as software having a switch function.

The pattern forming timing section 173 generates the test pattern by expanding the basic pattern data in the order indicated by the instruction information. The pattern forming timing section also controls the output timing of the generated test pattern.

The driver 174 supplies the test pattern output by the pattern forming timing section 173 to the DUT 200 as a signal. The comparator 175 compares a reference voltage to the voltage of the signal output by the DUT 200 in response to the input of the test pattern, and converts the comparison result into a logic value.

The comparison detecting section 176 compares the output of the comparator 175 to an expected value. In other words, the comparison detecting section 176 compares an expected pattern, which is expected as the output of the DUT 200 when the DUT 200 is supplied with the test pattern, to an output pattern that is the actual output of the DUT 200 when supplied with the test pattern. The comparison detecting section 176 determines a fail result when the expected pattern and the output pattern are not the same. The temporary result storage section 177 temporarily stores the comparison result of the comparison detecting section 176.

The result storage sections 166 store fail information that indicates the fail result and the failed pattern determined by the comparison detecting section 176. Each result storage section 166 is disposed independently in association with one of the pattern generating sections 170. By providing each pattern generating section 170 with a result storage section 166, the test results can be held or read independently even when a single stand-alone DUT 200 is allocated to each pattern generating section 170.

The pattern generating section 170 generates the test pattern to be supplied to the DUT 200 by expanding the basic pattern data in the order indicated by the instruction information stored in the temporary instruction information storage section 171, as described above. Since each pattern generating section 170 can independently generate the test pattern and independently hold and read the test result, a stand-alone DUT 200 can be allocated to each pattern generating section 170. In other words, the plurality of pattern generating sections 170 can independently generate each test pattern supplied to identical types of DUTs 200.

Figure 4:
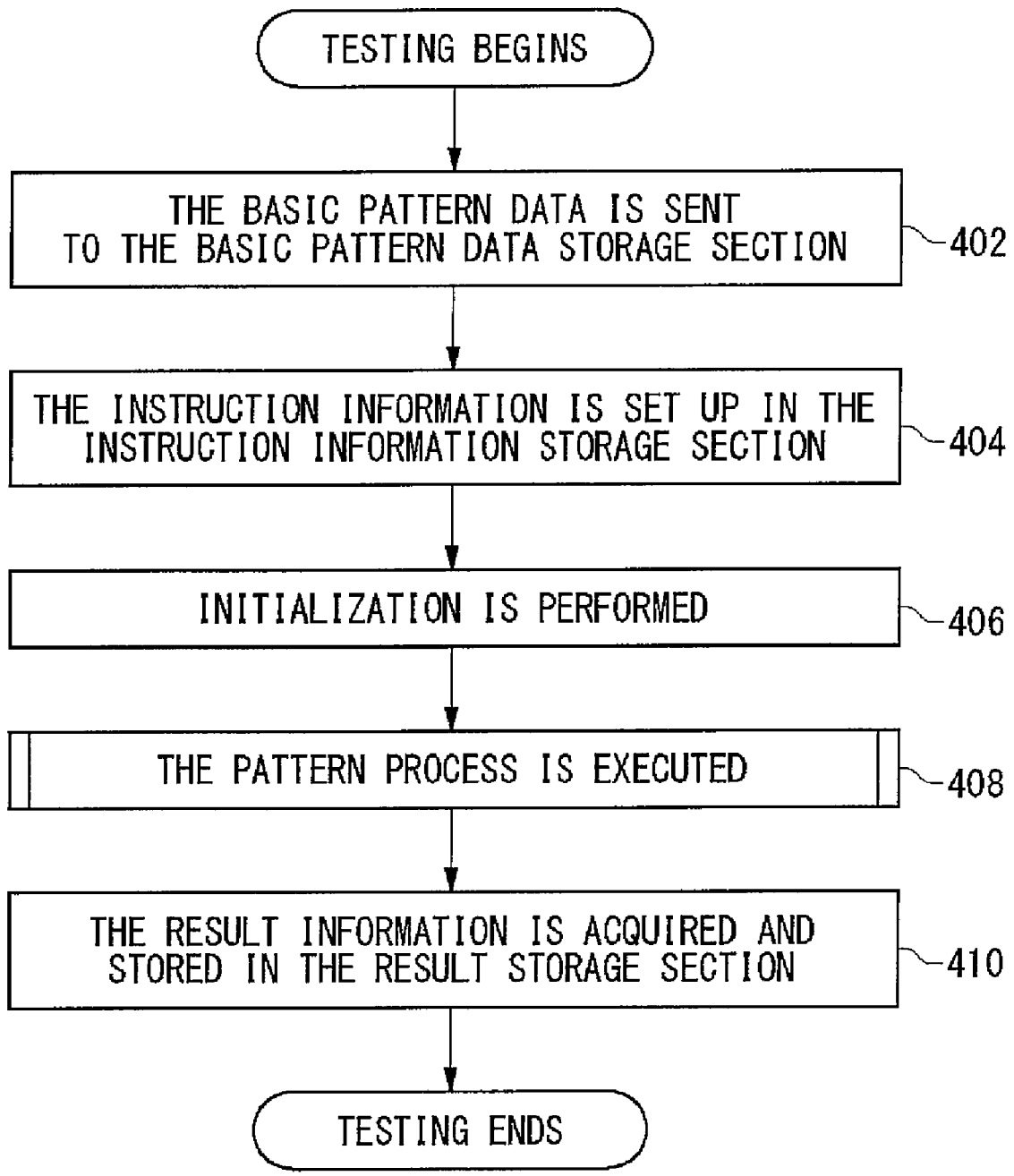
FIG. 4 is a flow chart of a test using the test apparatus 100 of the present embodiment.

FIG. 4 is a flow chart of a test using the test apparatus 100 of the present embodiment. When testing begins, the basic pattern data is stored in the basic pattern data storage section 172 (step 402). Next, the instruction information is stored in the instruction information storage section 161 (step 404). Thereafter, each section, such as the pattern generating section 170, is initialized (step 406).

After the initialization, the pattern process is performed (step 408). After the pattern process, the result information is acquired and stored in the result storage section 166 (step 410). Testing is then finished. After the testing is finished, an arbitrary test result is read from the result storage section 166 and this result is confirmed or analyzed, for example.

Figure 5:
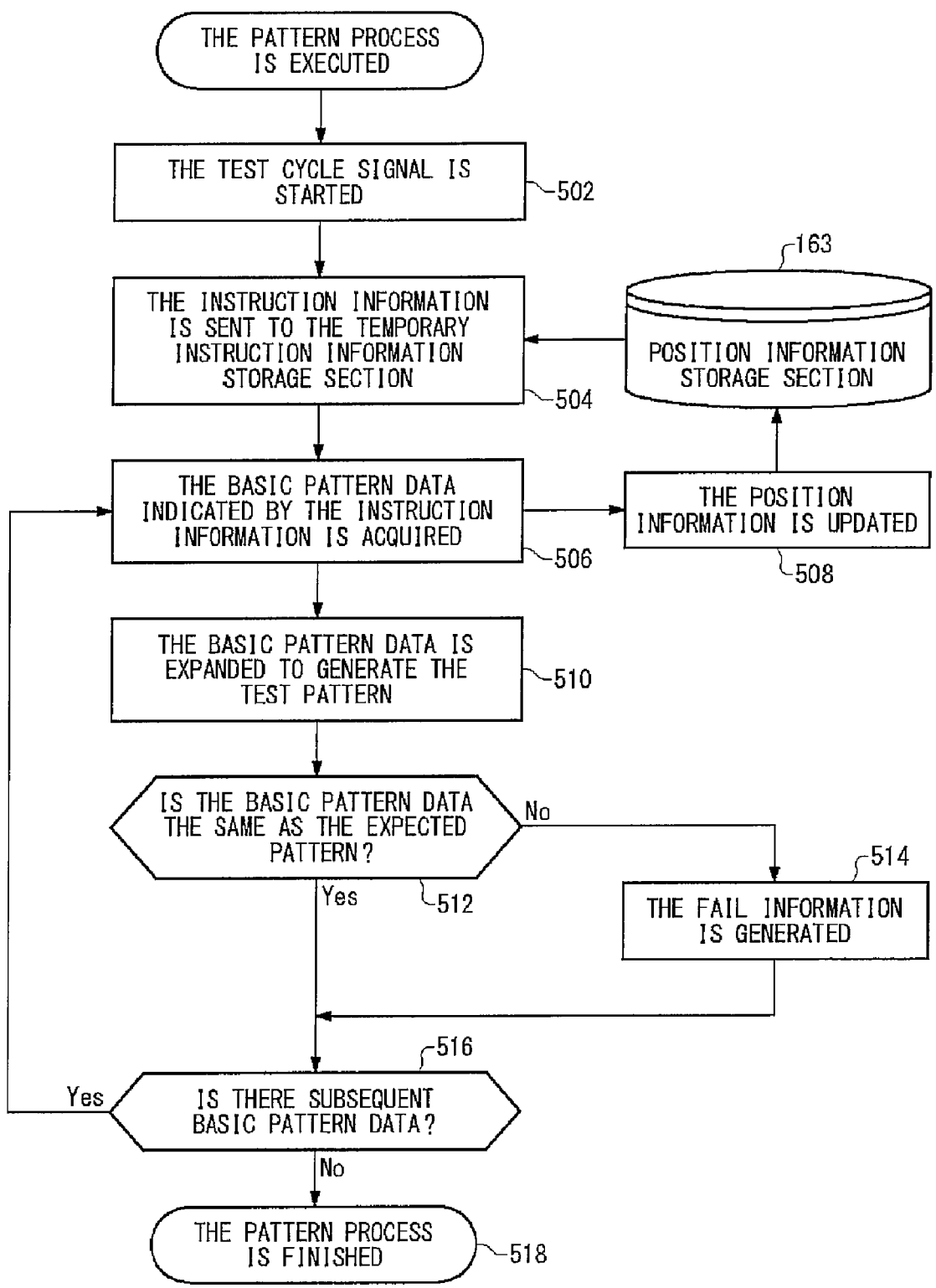
FIG. 5 is a flow chart of the pattern process.

FIG. 5 is a flow chart of the pattern process. When the pattern process begins, a test cycle signal is started (step 502). The instruction information is then transmitted to the temporary instruction information storage section 171 (step 504). At this time, the position information in the position information storage section 163 is referenced. The transmission of the instruction information to the temporary instruction information storage section 171 can be performed as needed if an opening occurs in a storage region of the temporary instruction information storage section 171, so that the operations of step 506 and onward can be performed independently.

Next, the basic pattern data indicated by the instruction information is acquired (step 506). Since the instruction information associated with the basic pattern data is unnecessary after the corresponding basic pattern data has been acquired, the position information is updated (step 508).

The acquired basic pattern data is expanded (step 510). The expansion of this data may be performed as described below. A circuit may be formed that holds the pattern strings of the basic patterns as the basic pattern data and writes the basic pattern data to a cache memory, for example, to output the pattern strings as the test patterns. As another example, a data table may be provided in advance that associates a prescribed pattern string with identification information identifying this pattern string, and this identification information can be included in the basic pattern data. In this case, a circuit is configured such that when the identification information is read, the pattern string indicated by the read identification information is written to the cache memory, for example, so that the pattern strings can be output as the test pattern.

The output test pattern is input to the DUT 200, the DUT outputs a pattern in response to the test pattern, and a judgment is made as to whether this output pattern of the DUT 200 is the same as the expected pattern (step 512). When the output pattern of the DUT 200 is not the same as the expected pattern (the 'NO' of step 512), the fail information is generated (step 514). When the output pattern of the DUT 200 is the same as the expected pattern (the 'YES' of step 512), the process moves on to a step of judging whether there is a subsequent basic pattern.

A judgment is made as to whether there is subsequent basic pattern data (step 516). When there is subsequent basic pattern data (the 'YES' of step 516), the process returns to step 506 and continues. When there is no subsequent basic pattern data (the 'NO' of step 516), the pattern process is finished (step 518).

According to the test apparatus 100 described above, even when a single stand-alone DUT 200 is allocated to each pattern generating section 170, the test apparatus 100 can test each DUT 200 with independent timings and store the test results. Therefore, the test apparatus 100 has higher efficiency because the number of unused pattern generating sections 170 is decreased. The test apparatus 100 is particularly effective when used with relatively small DUTs 200 having a small number of test terminals.

In the above embodiment, a single DUT 200 is allocated to a single pattern generating section 170, but two or more pattern generating sections 170 may test a single stand-alone DUT 200. Furthermore, a single DUT 200 may be tested by pattern generating sections 170 being controlled by different group control sections 160. In other words, the DUTs 200 may be tested within the test segments 140 or outside of the test segments 140. In both cases, the test apparatus 100 of the present embodiment can control the pattern generating sections 170 independently for favorable testing.

While an embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

As made clear from the above, according to the embodiment of the present invention, a test module, a test apparatus, and a test method using highly efficient pattern generating sections 170 can be realized.

What is claimed is:

1. A test module, comprising:
    an instruction information storage section that stores instruction information indicating an order in which basic patterns are expanded;
    a basic pattern data storage section that stores basic pattern data;
    a plurality of pattern generating sections that each include a temporary instruction information storage section, which temporarily stores a portion of the instruction information, and that each generate a test pattern supplied to a device under test by expanding the basic pattern data in the order indicated by the instruction information stored in the corresponding temporary instruction information storage section; and
    a plurality of position information storage sections that independently store position information indicating reading positions of the instruction information stored in the instruction information storage section that is common to the plurality of pattern generating sections, in association with each pattern generating section;
    wherein the basic pattern data is a unit of the test pattern, and
    wherein the instruction information storage section is provided for the plurality of pattern generating sections in common, and the plurality of position information storage sections are provided corresponding to the plurality of pattern generating sections one-to-one.

2. The test module according to claim 1, wherein the plurality of pattern generating sections independently generate each test pattern provided to devices under test of the same type.

3. The test module according to claim 2, further comprising an instruction information control section that reads a portion of the instruction information stored in the instruction information storage section from the reading positions indicated by the position information stored in the plurality of position information storage sections, and stores the read portions in the temporary instruction information storage sections, wherein the instruction information control section is independently associated with each of the plurality of pattern generating sections.

4. The test module according to claim 3, further comprising an arbiter that arbitrates reading requests generated by the plurality of instruction information control sections to read the portion of the instruction information from the instruction information storage section.

5. The test module according to claim 4, further comprising:
    comparison detecting sections that compare an expected pattern, which is expected as the output of the device under test when the device under test is supplied with the test pattern, to an output pattern that is actually output by the device under test when supplied with the test pattern, and determine a fail result when the test pattern and the output pattern are not identical; and
    result storage sections that store fail information indicating the fail result and the failed pattern detected by the comparison detecting section, wherein one comparison detecting section and one result storage section are independently associated with each of the plurality of pattern generating sections.

6. The test module according to claim 5, wherein the result storage sections store the fail information in association with the basic pattern in which the fail occurred.

7. A test apparatus, comprising:
an instruction information storage section that stores instruction information indicating an order in which basic patterns are expanded;
a basic pattern data storage section that stores basic pattern data;
a plurality of pattern generating sections that each include a temporary instruction information storage section, which temporarily stores a portion of the instruction information, and that each generate a test pattern supplied to a device under test by expanding the basic pattern data in the order indicated by the instruction information stored in the corresponding temporary instruction information storage section; and
a plurality of position information storage sections that independently store position information indicating reading positions of the instruction information stored in the instruction information storage section that is common to the plurality of pattern generating sections, in association with each pattern generating section;
wherein the basic pattern data is a unit of the test pattern, and
wherein the instruction information storage section is provided for the plurality of pattern generating sections in common, and the plurality of position information storage sections are provided corresponding to the plurality of pattern generating sections one-to-one.

8. A test method, comprising the following steps performed by a test apparatus:
storing basic pattern data;
storing, on an instruction information storage section, instruction information, in common for a plurality of pattern generating sections, indicating an order in which basic patterns are expanded;
independently storing, on a plurality of position information storage sections, position information indicating reading positions of the instruction information stored in the instruction information storage section, in association with each pattern generating section;
temporarily and independently storing a portion of the instruction information in association with each pattern generating section; and
generating a test pattern supplied to a device under test, in association with each pattern generating section, by expanding the basic pattern data in the order indicated by the instruction information stored during the temporary and independent storage of the portion of the instruction information;
wherein the basic pattern data is a unit of the test pattern, and
wherein the instruction information storage section is provided for the plurality of pattern generating sections in common, and the plurality of position information storage sections are provided corresponding to the plurality of pattern generating sections one-to-one.

* * * * *